United States Patent [19]
Ishida

[11] Patent Number: 5,937,325
[45] Date of Patent: Aug. 10, 1999

[54] FORMATION OF LOW RESISTIVITY TITANIUM SILICIDE GATES IN SEMICONDUCTOR INTEGRATED CIRCUITS

[75] Inventor: Emi Ishida, Sunnyvale, Calif.

[73] Assignee: Advanced Micro Devices, Inc., Sunnyvale, Calif.

[21] Appl. No.: 08/966,306

[22] Filed: Nov. 7, 1997

[51] Int. Cl.⁶ .................................................. H01L 21/268
[52] U.S. Cl. .......................... 438/655; 438/592; 438/649; 438/655; 438/656; 438/662; 438/664; 438/660; 438/683
[58] Field of Search .................................... 438/592, 649, 438/655, 656, 662, 663, 664, 682, 683, 660

[56] References Cited

U.S. PATENT DOCUMENTS

| | | |
|---|---|---|
| 4,635,347 | 1/1987 | Lien et al. . |
| 5,236,865 | 8/1993 | Sandhu et al. ........................ 438/530 |
| 5,258,095 | 11/1993 | Nagata et al. . |
| 5,541,138 | 7/1996 | Yamazaki et al. . |
| 5,545,574 | 8/1996 | Chen et al. ........................... 438/297 |
| 5,563,100 | 10/1996 | Matsubara ............................ 438/303 |
| 5,569,624 | 10/1996 | Weiner . |
| 5,593,924 | 1/1997 | Apte et al. ............................ 438/655 |
| 5,597,746 | 1/1997 | Prall . |
| 5,602,410 | 2/1997 | Schwalke et al. . |
| 5,612,253 | 3/1997 | Farahani et al. . |
| 5,665,646 | 9/1997 | Kitano .................................. 438/592 |
| 5,672,544 | 9/1997 | Pan ...................................... 438/305 |
| 5,726,479 | 3/1998 | Matsumoto et al. .................. 257/412 |
| 5,741,725 | 4/1998 | Inoue et al. ............................... 1/1 |
| 5,744,395 | 4/1998 | Shue et al. ........................... 438/592 |
| 5,750,437 | 5/1998 | Oda ...................................... 438/963 |

OTHER PUBLICATIONS

Chu et al., Contact Formation by Laser Annealing of Implanted Silicon, IBM Technical Disclosure Bulletin vol. 22 No. 2 (May 1980).

"Kinetics and nucleation model of the C49 to C54 phase transformation in $TiSi_2$ thin films on deep–sub–micron $n^+$ type polycrystalline silicon lines" J.A. Kittl, D.A. Prinhslow, P.P. Apte and M.F. Pas, *1995 American Institute of Physics, Appl. Phys. Lett.* 67(16), Oct. 16, 1995, pp. 2308–2310.

*Primary Examiner*—Charles Bowers
*Assistant Examiner*—Thanh Nguyen
*Attorney, Agent, or Firm*—Renner, Otto, Boisselle & Sklar, P.L.L.

[57] ABSTRACT

A method of forming a titanium silicide (69) includes the steps of forming a transistor having a source region (58), a drain region (60) and a gate structure (56) and forming a titanium layer (66) over the transistor. A first anneal is performed with a laser anneal at an energy level that causes the titanium layer (66) to react with the gate structure (56) to form a high resistivity titanium silicide phase (68) having substantially small grain sizes. The unreacted portions of the titanium layer (66) are removed and a second anneal is performed, thereby causing the high resistivity titanium silicide phase (68) to convert to a low resistivity titanium silicide phase (69). The small grain sizes obtained by the first anneal allow low resistivity titanium silicide phase (69) to be achieved at device geometries less than about 0.25 micron.

14 Claims, 4 Drawing Sheets

5,937,325

FORMATION OF LOW RESISTIVITY TITANIUM SILICIDE GATES IN SEMICONDUCTOR INTEGRATED CIRCUITS

TECHNICAL FIELD

The present invention generally relates to integrated circuits and, in particular, to a method for constructing low resistivity titanium silicide contacts in MOSFET structures.

BACKGROUND ART

Field-effect transistors (FETs) and other related insulated-gate electronic devices are mainstay components of MOS integrated circuits. A MOSFET generally consists of two closely spaced, doped regions in a substrate--the source and the drain. The region between the two is the channel above which a thin insulation layer is formed. A gate electrode is formed directly over and completely covering the insulation layer directly above the channel and a voltage applied to the gate affects the electronic properties of the channel region, whereby the MOSFET is turned on and off.

The abbreviation MOS (metal oxide semiconductor) has become somewhat of a misnomer because for many applications the gate is formed of a polysilicon material which is doped to render it conductive. Although such a gate is adequate to create a field in the channel region so as to control the state of the MOSFET, it is not without its operational problems. One of these problems is that polysilicon has a relatively high sheet resistance and therefore is not as good a conductor as metal. This, of course, results in slower devices. Hence, manufacturers of integrated circuits have taken to forming composite metal silicide electrodes and interconnections between circuit components.

As semiconductor device structures have continued to shrink below 0.25 micron, the resistivity of titanium silicide, which is commonly used as contacts for the source/drain regions and the poly gate, has become undesirably high. The reason for the increase in resistivity has to do with the standard two step process by which titanium silicide is formed. After a titanium layer has been formed via a blanket deposit, a low temperature anneal takes place to transform the titanium into the C49 phase of titanium silicide in the selective regions where a titanium and silicon interface exists. The C49 phase is a high resistivity phase and consequently undesirable as a final silicide material. The low temperature anneal prevents the reaction of titanium with the oxide regions (such as the sidewall spacers and isolation regions). After the C49 phase has been formed, the unreacted titanium portions (over the oxide regions) are removed and a second, high temperature anneal is conducted in which the C49 phase is converted into the low resistivity C54 titanium silicide phase. Unfortunately, as transistor line widths continue to decrease to 0.25 micron or less, the grain sizes of the silicide formed in the C49 phase become too large (approaching the device line width) which limit their conversion to the C54 (low resistivity) phase. Consequently, as transistor sizes decrease to 0.25 microns or less, the silicide resistivity increases in an undesirable manner due to inability to form the C54 phase.

Another problem experienced with titanium silicide contacts involve their formation using laser annealing. Laser annealing is a process by which a laser beam is radiated onto a wafer in a pulsed mode to anneal various semiconductor regions. In one type of prior art silicide formation 10, as illustrated in prior art FIG. 1, a source region 14, a drain region 16 and a poly gate 18 had silicides formed thereon with the same processing step. Unfortunately, the laser energy required to melt the source/drain regions 14 and 16 is higher than the poly gate 18; therefore the laser energy required to form the source region 14 and drain region 16 causes excessive melting of the poly gate 18 which results in degraded gate oxide quality and, in some cases, poly gate destruction.

One prior art solution to the above problems involved the addition of an amorphizing implant such as silicon or germanium to reduce the melting temperature of the poly gate 18 and source/drains 14 and 16. The goal of this process was to stay below the melting temperature of the polycrystalline, but above the melting temperature of the amorphized region which allowed for melting of the poly gate 18 and the source/drain regions 14 and 16 without melting through the entire thickness of the poly gate 18. Unfortunately, this prior art process solution adds process steps and causes increased defects, thereby resulting in increased leakage and enhanced diffusion.

Accordingly, there is a need in the art for low resistivity titanium silicide gates at device geometries less than 0.25 micron.

SUMMARY OF THE INVENTION

According to one aspect of the present invention, a method for forming a low resistivity titanium silicide gate at device geometries less than 0.25 microns is disclosed. The low resistivity contact is formed by decoupling the formation of the gate silicide and the source and drain silicide. The titanium silicide gate is formed in two steps: (1) formation of a high resistivity C49 titanium silicide phase using a laser anneal process, and (2) formation of a low resistivity C54 titanium silicide phase using a rapid thermal anneal (RTA). The first phase laser anneal generates the C49 phase with small grain sizes (less than the gate line width), thereby allowing the low resistivity C54 phase to be subsequently formed.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

Figure 1:
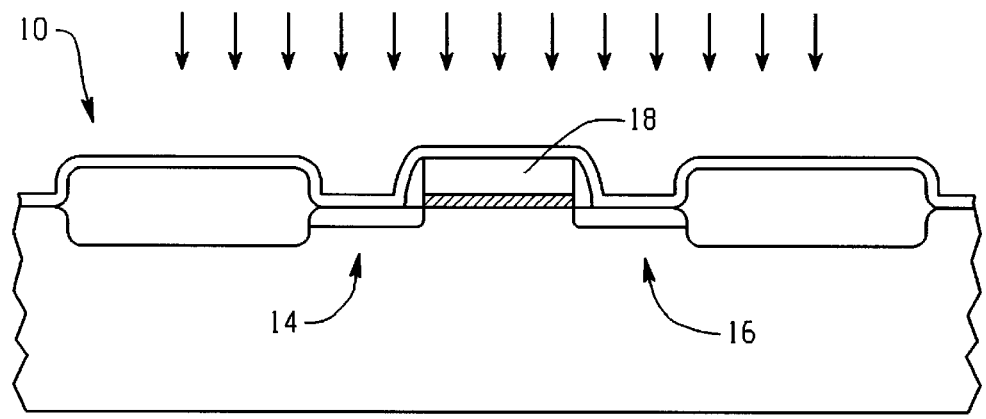
FIG. 1 is a cross-section diagram illustrating a prior art process, whereby a source, drain and gate are simultaneously exposed to a laser annealing step.

The present invention will now be described with reference to the drawings, wherein like reference numerals are used to refer to like elements throughout. An embodiment of the present invention includes a semiconductor processing method which decreases the resistivity of a titanium silicide gate, thereby allowing titanium silicide to be employed at device dimensions below 0.25 microns by separating the gate and source/drain silicide processing steps. The titanium silicide gate is formed using a laser annealing process to form a high resistivity C49 phase of titanium silicide having a substantially small grain size. After a wet strip, a rapid thermal anneal (RTA) process is applied to the poly gate region to convert the C49 titanium silicide phase to a low resistivity C54 titanium silicide phase. The source/drain titanium silicide regions, which are larger in dimension than the poly gate, are later formed via a standard RTA process for formation of both the C49 and C54 phases.

Figure 2:
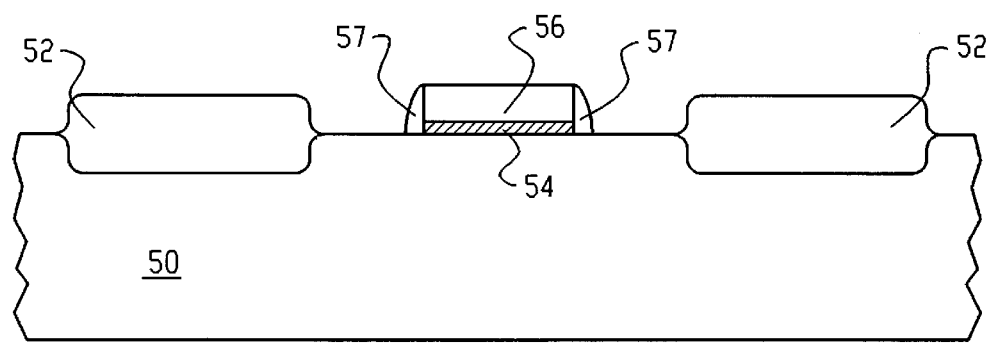
FIG. 2 is a cross-section diagram illustrating a gate structure overlying a gate oxide layer, wherein the gate oxide layer overlies a substrate in accordance with the present invention.

Referring initially to FIG. 2, the process according to a first embodiment of the present invention begins with a commercially available silicon wafer which defines a silicon substrate 50 for the integrated circuit being fabricated. Before forming the titanium silicide regions, the circuit components are constructed within and on the substrate 50 in accordance with well-known integrated circuit fabrication techniques. The details of the common steps are discussed in detail in many common references such as, for example, VLSI Technology, by S. M. Sze, $2^{nd}$ Edition (McGraw-Hill Publishing Co.). Consequently, the formation of these common steps will be discussed only briefly.

FIG. 2 illustrates a substrate 50 after the completion of several steps prior to forming the source and drain regions of a MOSFET. These preparatory steps are accomplished generally as follows. To form the isolation, one method first includes forming a silicon dioxide layer by thermal oxidation of the substrate 50 in an oxidizing atmosphere at an elevated temperature. The thickness is not critical and is often in the range of about 200 to 1,000 Angstroms. A layer of a different insulator, such as silicon nitride is then formed, usually by chemical vapor deposition (CVD). A common photoresist mask technique is then used to create a pattern in the silicon nitride. Finally, thick isolating regions 52 are then grown after which the silicon nitride and silicon oxide layers are removed. Next, a gate oxide layer 54 is formed by thermal growth, followed by a polysilicon gate 56 which is formed by a CVD process (such as, for example, an atmospheric pressure CVD, a low-pressure CVD or plasma-enhanced CVD) and patterned via a standard etch process (a dry, anisotropic etch process is preferred). Sidewall spacers 57 are then formed via, for example, a CVD oxide deposition followed by a directional etching such as, for example, reactive ion etching (RIE).

Figure 3A:
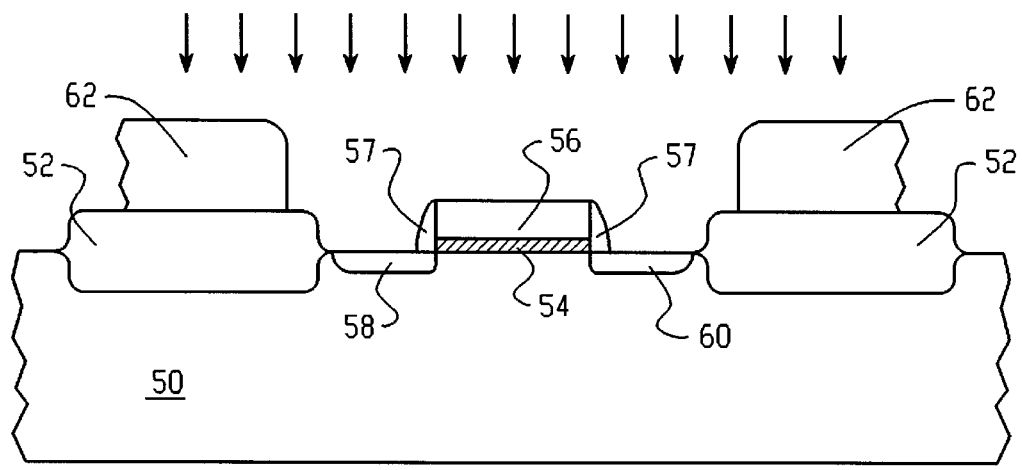
FIGS. 3a–3h are cross-section diagrams which illustrate the steps of forming a low resistivity titanium silicide gate according to an embodiment of the present invention.

Subsequent processing according to the present invention follows in accordance with FIGS. 3a—3h. In FIG. 3a, ultra-shallow source and drain regions 58 and 60 are formed in the substrate 50 using a mask 62, wherein the poly gate 56 and sidewall spacers 57 serve to self-align the source/drain regions 58 and 60. Shallow junctions are desirable for submicron device geometries and may be accomplished via several means such as through low energy ion implantation, tilted ion beam implantation, use of implanted silicides or polysilicon followed by a thermal treatment, or by projection-gas immersion laser doping (P-GILD). As is well known by those skilled in the art, the step of forming the source/drain regions 58 and 60 is often used to dope the polysilicon gate region 56. According to one exemplary embodiment, the shallow source/drain regions 58 and 60 have a depth of less than 100 nm and a dopant concentration of about $10^{19}$–$10^{20}$ ions/cm$^3$ and the poly gate 56 has a dopant concentration of about $10^{19}$–$10^{20}$ ions/cm$^3$. Although the present invention is described in conjunction with a standard MOS type transistor, the present invention may also be employed in LDD-type transistors or other type device structures.

Figure 3B:
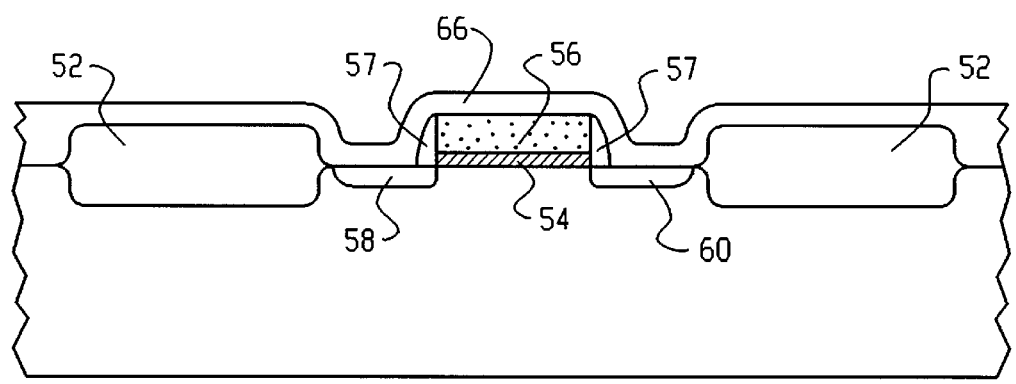
Figure 3C:
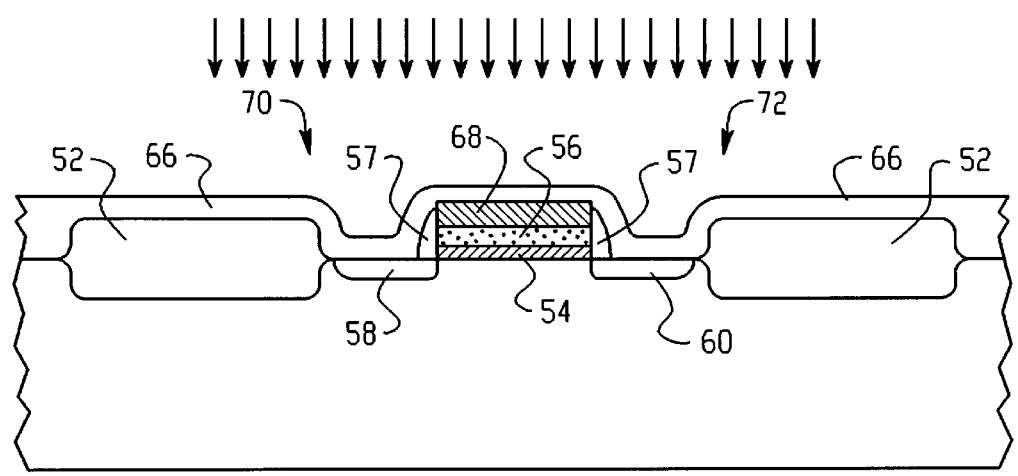
Figure 3D:
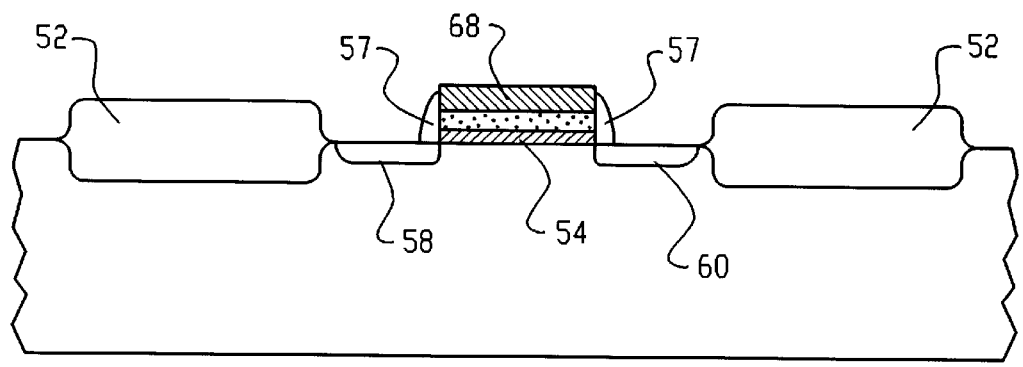

Subsequent to the formation of the source/drain regions 58 and 60, a titanium layer 66 is formed over the substrate 50 by sputtering, for example, as illustrated in FIG. 3b. Once deposited, the titanium layer 66 is exposed to a first phase anneal step using a laser annealing process to form the C49 phase of titanium silicide, as highlighted by region 68 in FIG. 3c. Preferably an excimer laser such as, for example, a XeCl laser (wavelength of 308 nm) is utilized and is preferably operated in a pulsed mode with an energy fluence range of about 300 to 1,000 mJ/cm$^2$. The laser annealing process is advantageous because only region 68 forms the C49 phase since the temperature is too low in the source/drain regions for the titanium 66 to react with the source and drain regions 58 and 60. The unreacted titanium layer 66 (regions 70 and 72) is then removed by a wet strip, for example, such as by application of an ammonia hydroxide/hydrogen peroxide solution, thereby leaving the low resistivity C49 titanium silicide region 68 above only the polysilicon gate, as illustrated in FIG. 3d.

The C49 phase silicide region 68 is substantially different than a prior art C49 phase region formed by a standard, low temperature RTA because the laser annealing process provides grain sizes that are substantially smaller than the C49 phase grain sizes provided by the RTA. Laser annealing provides smaller grain sizes than RTA because the laser melting occurs so quickly that grain sizes do not grow appreciably. Consequently, the grain sizes in the C49 phase are smaller than the gate line width (reportedly much less than about 0.25 micron). Since the grain sizes in the C49 phase silicide region 68 are much less than 0.25 micron, the C54 phase may then be formed in a second anneal step. Without the first phase laser anneal, however, the low resistivity C54 phase cannot be conventionally formed at device geometries below 0.25 micron because the large grain sizes that would otherwise exist in the C49 phase.

Figure 3E:
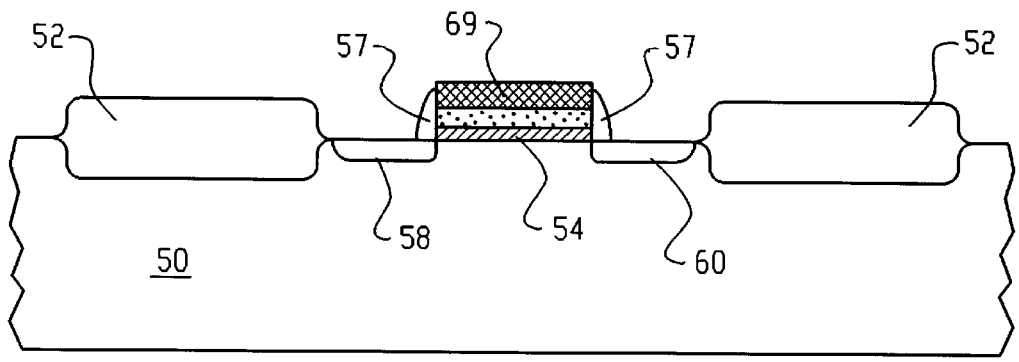

After the C49 phase has been created with the laser anneal process, a second, high temperature anneal is performed using an RTA with a temperature range of about 700–900° C. for about 15–60 seconds to form the low resistivity C54 titanium silicide phase 69 as shown in FIG. 3e. Since the grain sizes in the C49 phase formed by the laser anneal process are small, the C54 phase may be established. Consequently, a low resistivity titanium silicide 69 is formed at device geometries below 0.25 micron.

Figure 3F:
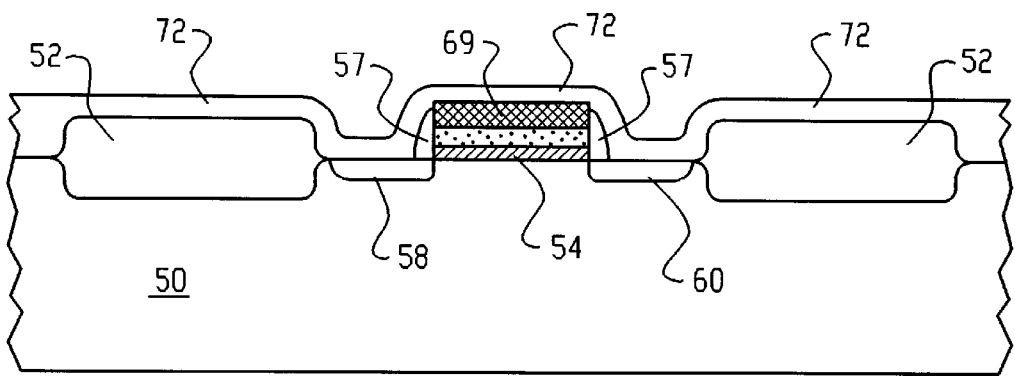
Figure 3G:
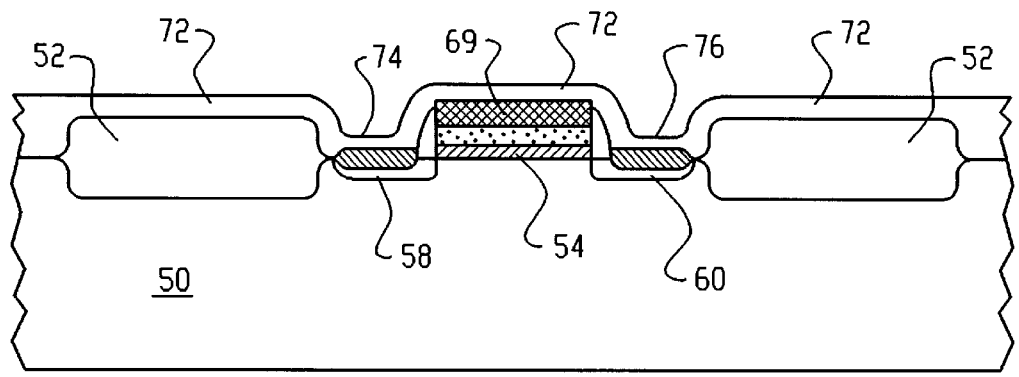

Once the silicide gate 69 has been formed, silicides can then be formed for the source region 58 and the drain region 60. Another layer 72 of titanium is formed over the structure as illustrated in FIG. 3f and a first RTA is performed at about 500–700° C. for about 10–60 seconds to form the C49 phase regions 74 and 76 on the source region 58 and drain region 60, respectively, as illustrated in FIG. 3g. Although the grain sizes in the C49 phase are large (greater than or equal to the line width of the gate) due to the anneal being performed with RTA, since the source region 58 and drain region 60 are larger than the gate (>0.25 micron), a subsequent transition to the C54 phase can still be obtained. (Note that the figures are not necessarily drawn to scale, but rather are used for illustrative purposes). Therefore, after performing another wet strip to remove the unreacted portions of titanium 72, a second, high temperature RTA is performed at a temperature of about 700–900° C. for about 15–60 seconds to form the C54 titanium silicide phase. In this manner, the source silicide 78 and drain silicide 80 are formed as illustrated in FIG. 3h.

Standard fabrication techniques can next be used to deposit standard remaining layers necessary to finalize the particular integrated circuit device, such as further insulation, metallization, and passivation layers. The resulting structure has a low resistivity gate silicide 69 at device geometries less than 0.25 microns.

Figure 3H:
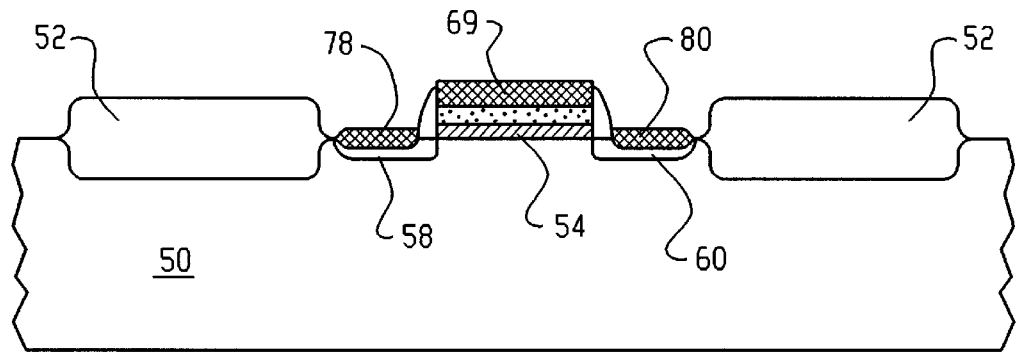
Figure 4:
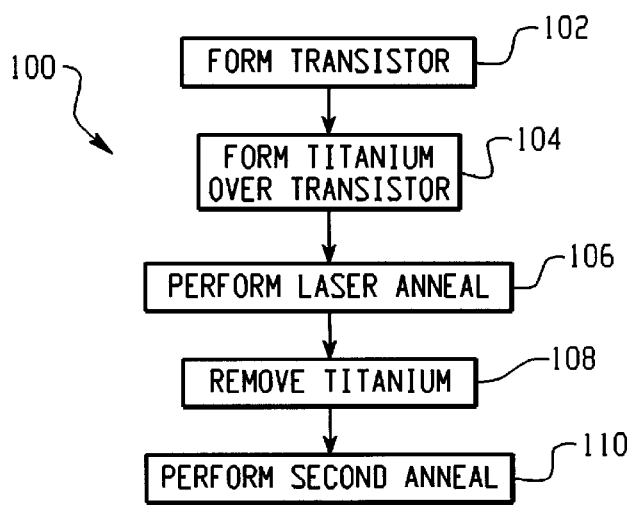
FIG. 4 is a flow chart illustrating manufacturing steps in a method for forming a gate silicide at device geometries less than 0.25 microns in accordance with the embodiment of the present invention exemplified in FIGS. 3a–3h.

The process for fabricating the gate silicide contact of FIG. 3h may be broadly characterized in an integrated circuit manufacturing process 100 as illustrated in FIG. 4. At a step 102, the transistor is formed, having the gate 56 overlying the gate oxide 54 and separating the source 58 and drain 60. At step 104, the titanium layer 66 is formed and a laser anneal is performed at step 106. The laser anneal energy is sufficient to make the titanium layer 66 react with the polysilicon gate 56, thereby forming the C49 titanium silicide phase 68, but not sufficient to react with the source and drain regions 58 and 60. The unreacted titanium 66 is removed at step 108 and a second anneal is performed at step 110 to convert the C49 phase 68 to the low resistivity C54 phase 69. The laser anneal step 106 operates with nanosecond pulses which do not permit sufficient time for the grain sizes in the C49 phase to approach the gate line width. Consequently, the small grain sizes in the C49 phase permit the C54 phase to be achieved at small device geometries.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a titanium silicide, comprising the steps of:
    forming a transistor having a source region, a drain region and a gate structure;
    forming a titanium layer over the transistor;
    performing a laser anneal at an energy level that causes the titanium layer to react with the gate structure to form a high resistivity titanium silicide phase and not react in similar manner with the source region and the drain region;
    removing portions of the titanium layer that did not form the high resistivity titanium silicide phase; and
    performing a second anneal, thereby causing the high resistivity titanium silicide phase to convert to a low resistivity titanium silicide phase.

2. The method of claim 1, wherein performing the laser anneal comprises irradiating the titanium layer with an excimer laser.

3. The method of claim 2, wherein the excimer laser is a XeCl laser having a wavelength of 308 nm.

4. The method of claim 1, wherein performing the laser anneal comprises irradiating the titanium layer with an excimer laser in a pulsed mode.

5. The method of claim 1, wherein performing the laser anneal comprises irradiating the titanium layer with an excimer laser with a fluence of about 300–1,000 mJ/cm$^2$.

6. The method of claim 1, wherein the high resistivity titanium silicide phase comprises a C49 titanium silicide.

7. The method of claim 1, wherein the low resistivity titanium silicide phase comprises a C54 titanium silicide.

8. The method of claim 1, wherein performing the second anneal comprising subjecting the transistor to an RTA which is performed at a temperature of about 700–900° C. for about 15–60 seconds.

9. A method of forming a titanium silicide, comprising the steps of:
    forming a transistor having a source region, a drain region and a gate structure;
    forming a titanium layer over the transistor;
    performing a laser anneal at an energy level that causes the titanium layer to react with the gate structure to form a high resistivity titanium silicide phase and not react in similar manner with the source region and the drain region;
    removing portions of the titanium layer that did not form the high resistivity titanium silicide phase;
    performing a second anneal, thereby causing the high resistivity titanium silicide phase to convert to a low resistivity titanium silicide phase;
    forming a second titanium layer over the transistor;
    subjecting the transistor to a third anneal, thereby forming a high resistivity titanium silicide phase at the source region and the drain region; and
    subjecting the transistor to a fourth anneal, thereby forming a low resistivity titanium silicide phase at the source region and the drain region.

10. The method of claim 9, wherein the third anneal is a low temperature anneal and the fourth anneal is a high temperature anneal.

11. The method of claim 9, wherein the third anneal is an RTA performed at a temperature of about 500–700° C. for about 10–60 seconds.

12. The method of claim 9, wherein the fourth anneal is an RTA performed at a temperature of about 700–900° C. for about 15–60 seconds.

13. The method of claim 1, wherein removing portions of the titanium layer comprises performing a wet strip.

14. The method of claim 13, wherein performing the wet strip comprises applying an ammonia hydroxide/hydrogen peroxide solution.

* * * * *